United States Patent
Matsukawa

(10) Patent No.: US 6,656,775 B1
(45) Date of Patent: Dec. 2, 2003

(54) SEMICONDUCTOR SUBSTRATE, SEMICONDUCTOR DEVICE, AND MANUFACTURING METHOD THEREOF

(75) Inventor: Kazuhito Matsukawa, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 118 days.

(21) Appl. No.: 09/668,368

(22) Filed: Sep. 25, 2000

(30) Foreign Application Priority Data

Apr. 14, 2000 (JP) .................................. P2000-113170

(51) Int. Cl.⁷ .......................... H01L 21/00; H01L 21/84
(52) U.S. Cl. ...................... 438/149; 438/405; 438/766
(58) Field of Search ................................ 438/207, 149, 438/308, 405, 415, 432, 766

(56) References Cited

U.S. PATENT DOCUMENTS 5,534,446 A * 7/1996 Tachimori et al. .......... 438/766

FOREIGN PATENT DOCUMENTS

| JP | 407335847 A | * 12/1995 |
| JP | 9-266145 | 10/1997 |
| JP | 10-303207 | 11/1998 |

* cited by examiner

Primary Examiner—Phat X. Cao
Assistant Examiner—Theresa T. Doan
(74) Attorney, Agent, or Firm—Oblon, Spivak, McClelland, Maier & Neustadt, P.C.

(57) ABSTRACT

A semiconductor substrate that suppresses not only auto doping but also warpage can be provided by disposing an oxide film (4) at a position in a semiconductor substrate (1), so as to be apart from a main surface (1a) and a reverse surface (1b). The oxide film (4) can be so disposed that it is apart not less than 200 nm from the reverse surface (1b), and extends throughout the semiconductor substrate (1) in a thickness of 400 to 1000 nm, by implanting oxygen ion from the reverse surface (1b), followed by annealing.

11 Claims, 2 Drawing Sheets

<PRIOR ART>

SEMICONDUCTOR SUBSTRATE, SEMICONDUCTOR DEVICE, AND MANUFACTURING METHOD THEREOF

BACKGROUND OF THE INVENTION

1. Field of the Invention

The present invention relates to a technique of suppressing a so-called auto doping when performing an epitaxial growth of a semiconductor substrate.

2. Description of the Background Art

There has conventionally been proposed the technique of forming a thin epitaxial layer such as of silicon in a thickness of about several hundreds of nanometers, on the surface of a semiconductor substrate such as a silicon substrate. In some cases, the impurity concentration of the silicon substrate is set to a relatively high value. For instance, when a P type silicon substrate is employed and a P type silicon is formed as an epitaxial layer, the boron concentration of the silicon substrate is set to about $1\times10^{18}$ cm$^{-3}$.

On the other hand, the art of epitaxial growth has presented the problem of contamination being called "auto doping." This is such contamination that, during epitaxial growth or the heat treatment in the step of manufacturing a semiconductor device by using an epitaxial layer, the impurity contained in a semiconductor substrate diffuses outside the substrate, and the diffused impurity enters the epitaxial layer. For instance, epitaxial growth has suffered from the phenomenon that the impurity contained in a silicon substrate is introduced into the source gas of the epitaxial growth.

To suppress the above-mentioned contamination, there has been proposed a technique of covering a semiconductor substrate on the side opposite from an epitaxial layer to be disposed. FIG. 5 is a sectional view illustrating this conventional technique. An oxide film 3 is formed on the reverse surface of a semiconductor substrate 1, e.g., a surface not subjected to mirror finish, and an epitaxial layer 2 is formed on the surface opposite from the oxide film 3 (hereinafter referred to as "main surface"). With this structure, the oxide film 3 suppresses impurity diffusing from the reverse surface of the semiconductor substrate 1, which results in suppressing auto doping. The technique of providing the oxide film 3 on the reverse surface of the semiconductor substrate 1 is described in Japanese Patent Application Laid-Open No. 9-266145 (1997), which discloses a technique employing a spin on glass film and atmospheric pressure chemical vapor deposition.

When the oxide film 3 is disposed on the reverse surface of the semiconductor substrate 1, however, the resulting semiconductor substrate 10 suffers from a noticeable warpage.

SUMMARY OF THE INVENTION

According to a first aspect of the invention, a semiconductor substrate comprises: first and second surfaces; and an oxide film apart from the first and second surfaces and extending throughout the semiconductor substrate.

According to a second aspect, the semiconductor substrate of the first aspect is characterized in that the distance between the oxide film and the second surface corresponds to a thickness on the order of $10^{-3}$ of a thickness of the semiconductor substrate.

According to a third aspect, the semiconductor substrate of the first or second aspect is characterized in that the oxide film has a thickness of 400 to 1000 nm.

According to a fourth aspect, the semiconductor substrate according to any of the first to third aspects further comprises an epitaxial layer disposed on the first surface.

According to a fifth aspect, a semiconductor device comprises a semiconductor element disposed in the epitaxial layer of the semiconductor substrate according to the fourth aspect.

According to a sixth aspect, a method of manufacturing a semiconductor substrate comprises the steps of (a) providing a semiconductor substrate having first and second surfaces; and (b) forming an oxide film apart from the first and second surfaces and extending throughout the semiconductor substrate.

According to a seventh aspect, the method of the sixth aspect is characterized in that the step (b) includes the steps of: (b-1) introducing oxygen ion into the semiconductor substrate from the second surface; and (b-2) performing heat treatment after the step (b-1).

According to an eighth aspect, the method of the seventh aspect further includes the step (c), after the step (b), of forming an epitaxial layer on the first surface.

According to a ninth aspect, the method of the seventh aspect further includes the step (d) of making a semiconductor element by using the epitaxial layer.

With the semiconductor substrate of the first aspect or the method of manufacturing a semiconductor substrate of the sixth aspect, the auto doping to a semiconductor device and the warpage of the semiconductor substrate can be suppressed when a semiconductor element is formed on the first or second surface.

With the semiconductor substrate of the second aspect, less semiconductor is present between the oxide film and the second surface, and therefore the amount of auto doping is negligible.

With the semiconductor substrate of the third aspect, any warpage can be suppressed without any loss of the effect of suppressing auto doping.

With the semiconductor substrate of the fourth aspect, the impurity diffusion from the second surface is suppressed, thus reducing impurity to be introduced into the epitaxial layer.

With the semiconductor device of the fifth aspect, it is easy to obtain a desired characteristic because of the use of an epitaxial layer that is less subject to auto doping.

With the method of the seventh aspect, it is able to manufacture the semiconductor substrate of the first aspect.

With the method of the eighth aspect, since the impurity diffusion from the second surface is suppressed, the impurity introduction is reduced even when an epitaxial layer is formed in the step (c).

With the method of the ninth aspect, it is easy to obtain a semiconductor device with a desired characteristic because of the use of an epitaxial layer that is less subject to auto doping.

It is an object of the present invention to provide a technique of suppressing not only auto doping but also the warpage of a semiconductor substrate.

These and other objects, features, aspects and advantages of the present invention will become more apparent from the following detailed description of the present invention when taken in conjunction with the accompanying drawings.

DESCRIPTION OF THE PREFERRED EMBODIMENT

FIGS. 1 to 4 are sectional views illustrating a sequence of steps in a method of manufacturing a semiconductor device according to one preferred embodiment of the invention.

Firstly, there is provided a semiconductor substrate 1 having a main surface 1a and a reverse surface 1b. The semiconductor substrate 1 is, for example, a silicon wafer, which contains boron in a concentration of $1 \times 10^{18}$ to $1 \times 10^{20}$ cm$^{-3}$. The main surface 1a is a surface to be subjected to epitaxial growth, and the reverse surface 1b is the surface opposite to the main surface 1a.

Figure 1:
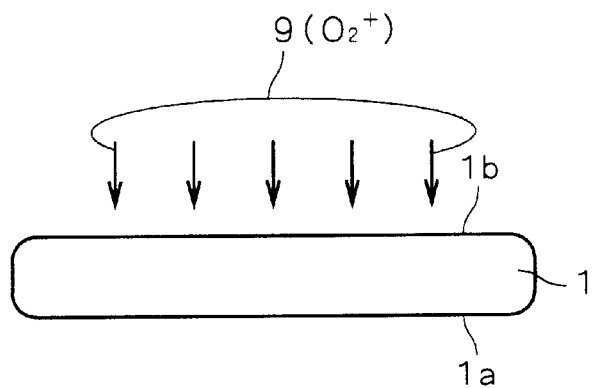
FIGS. 1 to 4 are sectional views illustrating a sequence of steps in a method of manufacturing a semiconductor device according to one preferred embodiment of the invention.

Referring to FIG. 1, oxygen ion ($O_2^+$) 9 is implanted to the entire surface from the reverse surface 1b, in a known manner. Then, an annealing of the resulting structure is performed. For example, the annealing is conducted at 1300 to 1400° C. in an atmosphere of hydrogen or argon, for one hour.

Figure 2:
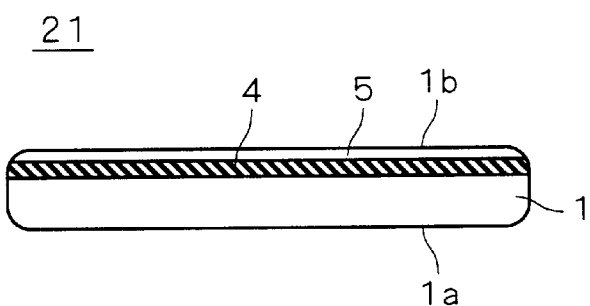

FIG. 2 shows the structure of a semiconductor substrate 21 obtained through the foregoing steps. An oxide film 4 is formed at a position within the semiconductor substrate 1, so as to be apart from not only the main surface 1a but also the reverse surface 1b. The oxide film 4 is disposed apart not less than 200 nm from the reverse surface 1b, and extends throughout the semiconductor substrate 1, in a thickness of 400 to 1000 nm. The oxide film 4 can be disposed at such a position by controlling the above-mentioned conditions of ion implantation. For instance, the energy and dose are set to 150 to 170 keV and $1.7 \times 10^{18}$ cm$^{-3}$, respectively.

Figure 3:
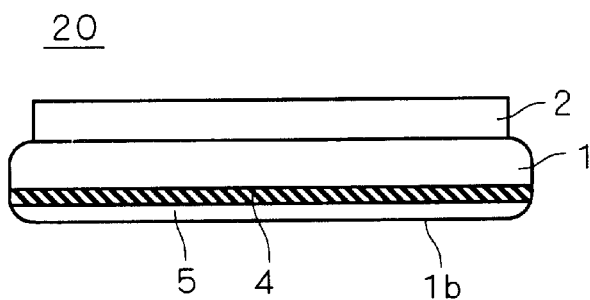

Subsequently, an epitaxial growth of the main surface 1a is performed to form an epitaxial layer 2. For instance, the epitaxial layer 2 is of p type silicon. FIG. 3 shows the structure of the resulting semiconductor substrate 20. Mirror finish on the main surface 1a may be performed after obtaining the semiconductor substrate 21 and before the epitaxial growth. Alternatively, it may be performed before the annealing.

As stated earlier with respect to FIG. 2, since the oxide film 4 is disposed in the semiconductor substrate 21, the amount of warp of the semiconductor substrate 20 is decreased better than if an oxide film is disposed on the reverse surface 1b. For a silicon wafer of 720 $\mu$m thick and 20.3 cm in diameter, when an oxide film of 300 nm is disposed on the reverse surface, the amount of warp has conventionally been 45 to 50 $\mu$m, whereas in the invention it is 30 to 35 $\mu$m.

A part 5 of the semiconductor substrate 1 is present between the oxide film 4 and reverse surface 1b, in the semiconductor substrates 20 and 21. Based on the foregoing description, however, the thickness of the part 5 is about 200 nm, and it is merely on the order of $10^{-3}$, as viewed from the entire thickness of the semiconductor substrate 1 of which thickness is usually about several hundreds of $\mu$m. Therefore, the amount of impurity diffused from the part 5 is extremely small.

Furthermore, for a silicon wafer of 720 $\mu$m thick and 20.3 cm in diameter, when an oxide film of 300 nm is disposed on the reverse surface, the amount of boron in an epitaxial layer has conventionally been about $8.3 \times 10^{12}$ cm$^{-3}$, whereas in the invention it is about $7.0 \times 10^{12}$ cm$^{-3}$. This shows an improvement in reducing the amount of boron.

The reason for this seems to be that in the present invention the oxide film 4 also covers the edge of the wafer, and the boron diffusion from the edge is therefore considerably reduced, thereby to compensate for increase due to the impurity diffusion from the part 5.

Thus, the present invention permits to suppress not only auto doping but also the warpage of the semiconductor substrate. It should be noted that the function of suppressing impurity diffusion is insufficient when the thickness of the oxide film 4 is below 400 nm, and warpage is increased when it exceeds 1000 nm.

Figure 4:
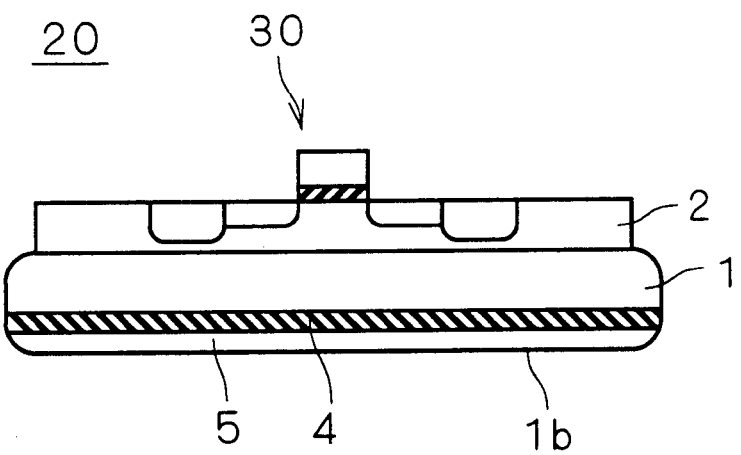
Figure 5:
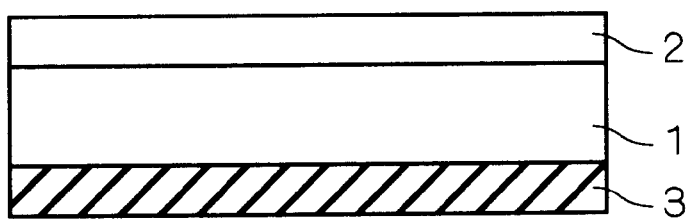
FIG. 5 is a sectional view of a conventional technique.

When an epitaxial layer 2 is formed by using a semiconductor substrate 21, it is suppressed that the epitaxial layer 2 suffers from auto doping due to impurity. It is also possible to suppress auto doping when a semiconductor element, e.g., a transistor 30, is formed on the epitaxial layer 2 by using a semiconductor substrate 20, as shown in FIG. 4. Accordingly, the method of manufacturing a semiconductor device by using a semiconductor substrate 20 or 21, produces the effect of suppressing not only auto doping to the semiconductor device but also the warpage of the semiconductor substrate. To suppress the warpage of the semiconductor substrate is particularly useful in the step of mask alignment.

A semiconductor device obtained by the method of manufacturing a semiconductor device as described, of course, comes within the scope of the invention. It is easy to obtain a desired characteristic because a semiconductor element is made by using an epitaxial layer that is less subject to auto doping.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:

(a) providing a semiconductor substrate having first and second surfaces, wherein said semiconductor substrate comprises silicon and contains boron in a concentration of $1 \times 10^{18}$ to $1 \times 10^{20}$ cm$^{-3}$; and (b) forming an oxide film apart from said first and second surfaces and extending throughout said semiconductor substrate.

2. The method of manufacturing a semiconductor device according to claim 1 wherein said step (b) includes the steps of:

(b-1) introducing oxygen ion into said semiconductor substrate from said second surface; and (b-2) performing heat treatment after said step (b-1).

3. The method of manufacturing a semiconductor device according to claim 2 further including the step (c), after said step (b), of forming an epitaxial layer on said first surface.

4. The method of manufacturing a semiconductor device according to claim 3 further including the step (d) of making a semiconductor element by using said epitaxial layer.

5. A method of manufacturing a semiconductor device comprising the steps of, in order:

(a) providing a semiconductor substrate having first and second surfaces;

(b) forming an oxide film apart from said first and second surfaces and extending throughout said semiconductor substrate, wherein said step (b) includes the steps of:

(b-1) introducing oxygen ion into said semiconductor substrate from said second surface; and (b-2) performing heat treatment after said step (b-1); and (c) forming an epitaxial layer on said first surface.

6. The method of manufacturing a semiconductor device according to claim 5 further including the step (d) of making a semiconductor element by using said epitaxial layer.

7. A method of manufacturing a semiconductor device comprising the steps of:

(a) providing a semiconductor substrate having first and second surfaces; and (b) forming an oxide film apart from said first and second surfaces and extending throughout said semiconductor substrate, wherein the distance between said oxide film and said second surface corresponds to a thickness on the order of $10^{-3}$ of a thickness of said semiconductor substrate.

8. The method of manufacturing a semiconductor device according to claim 7 wherein said step (b) includes the steps of:

(b-1) introducing oxygen ion into said semiconductor substrate from said second surface; and (b-2) performing heat treatment after said step (b-1).

9. The method of manufacturing a semiconductor device according to claim 8 further including the step (c), after said step (b), of forming an epitaxial layer on said first surface.

10. The method of manufacturing a semiconductor device according to claim 9 further including the step (d) of making a semiconductor element by using said epitaxial layer.

11. The method of manufacturing a semiconductor device according to claim 7, wherein said semiconductor substrate comprises silicon and contains boron in a concentration of $1 \times 10^{18}$ to $1 \times 10^{20}$ cm$^{-3}$.

* * * * *